United States Patent
Hong et al.

(10) Patent No.: US 12,158,808 B2
(45) Date of Patent: Dec. 3, 2024

(54) METHOD OF CHARACTERIZING ERRORS IN NAND FLASH MEMORY, AND ERROR ESTIMATION METHOD AND STORAGE SYSTEM CONTROL METHOD USING THE SAME

(71) Applicant: FADU Inc., Seoul (KR)

(72) Inventors: Sung Gil Hong, Seoul (KR); Ha Young Lim, Seoul (KR); Ji Yoon Jung, Seoul (KR); Do Hee Kim, Seoul (KR)

(73) Assignee: FADU Inc., Seoul (KR)

( * ) Notice: Subject to any disclaimer, the term of this patent is extended or adjusted under 35 U.S.C. 154(b) by 64 days.

(21) Appl. No.: 18/093,432

(22) Filed: Jan. 5, 2023

(65) Prior Publication Data

US 2023/0297471 A1 Sep. 21, 2023

Related U.S. Application Data

(60) Provisional application No. 63/320,291, filed on Mar. 16, 2022.

(30) Foreign Application Priority Data

Mar. 16, 2022 (KR) .................. 10-2022-0032485

(51) Int. Cl.
*G06F 11/00* (2006.01)
*G06F 11/10* (2006.01)
*G11C 29/52* (2006.01)

(52) U.S. Cl.
CPC ...... *G06F 11/1068* (2013.01); *G06F 11/1008* (2013.01); *G11C 29/52* (2013.01)

(58) Field of Classification Search
CPC ............. G06F 11/1008; G06F 11/1068; G11C 29/52
See application file for complete search history.

(56) References Cited

U.S. PATENT DOCUMENTS

| | | | | |
|---|---|---|---|---|
| 5,428,621 A | * | 6/1995 | Mehrotra | G11C 29/82 714/721 |
| 9,136,009 B1 | * | 9/2015 | Lu | G11C 16/0408 |
| 10,642,747 B1 | * | 5/2020 | Jagtap | G06F 12/10 |

(Continued)

FOREIGN PATENT DOCUMENTS

| KR | 10-2017-0066084 A | 6/2017 |
|---|---|---|
| KR | 10-2017-0118291 A | 10/2017 |

(Continued)

OTHER PUBLICATIONS

Korean office action issue on Nov. 3, 2022 in corresponding Korean Patent application No. 10-2022-0032485 ( 3 pages in Korean).

*Primary Examiner* — Joshua P Lottich
(74) *Attorney, Agent, or Firm* — NSIP Law

(57) ABSTRACT

A method of characterizing an error in a NAND flash memory, and an error estimation method and a storage system control method using the same are provided. The method of characterizing an error in a NAND flash memory characterizes an error source of the NAND flash memory using a center distance between one pattern and another pattern among a plurality of patterns in a threshold voltage distribution of NAND flash memory cells as a parameter.

8 Claims, 9 Drawing Sheets

(56) References Cited

U.S. PATENT DOCUMENTS

| | | | | |
|---|---|---|---|---|
| 11,029,889 | B1* | 6/2021 | Sharon | G11C 16/08 |
| 2010/0192042 | A1* | 7/2010 | Sharon | G06F 11/1068 |
| | | | | 714/763 |
| 2015/0186072 | A1* | 7/2015 | Darragh | G11C 16/3495 |
| | | | | 711/103 |
| 2016/0062656 | A1* | 3/2016 | Ramaraju | G11C 16/10 |
| | | | | 711/103 |
| 2016/0110124 | A1* | 4/2016 | Camp | G06F 11/073 |
| | | | | 714/704 |
| 2018/0033491 | A1* | 2/2018 | Marelli | G11C 16/26 |
| 2018/0210788 | A1* | 7/2018 | Yang | G11C 16/26 |
| 2021/0027845 | A1* | 1/2021 | Lu | G06F 3/0604 |
| 2021/0118519 | A1* | 4/2021 | Muchherla | G11C 29/44 |
| 2022/0020433 | A1* | 1/2022 | Seo | G11C 16/3404 |
| 2023/0195559 | A1* | 6/2023 | Hartz | G11C 29/4401 |
| | | | | 714/47.2 |
| 2023/0197137 | A1* | 6/2023 | Hartz | G11C 16/349 |
| | | | | 365/222 |

FOREIGN PATENT DOCUMENTS

| | | | |
|---|---|---|---|
| KR | 10-2017-0120442 | A | 10/2017 |
| KR | 10-2020-0132270 | A | 11/2020 |
| KR | 10-2020-0139044 | A | 12/2020 |

\* cited by examiner

METHOD OF CHARACTERIZING ERRORS IN NAND FLASH MEMORY, AND ERROR ESTIMATION METHOD AND STORAGE SYSTEM CONTROL METHOD USING THE SAME

CROSS-REFERENCE TO RELATED APPLICATIONS

This application claims the benefit under 35 USC § 119(e) of U.S. Provisional Application No. 63/320,291 filed on Mar. 16, 2022, and the benefit under 35 USC § 119(a) of Korean Patent Application No. 10-2022-0032485 filed on Mar. 16, 2022, in the Korean Intellectual Property Office, the entire disclosures of which are incorporated herein by reference for all purposes.

BACKGROUND OF THE INVENTION

Field of the Invention

The present invention relates to a method of characterizing errors in a NAND flash memory, and an error estimation method and a storage system control method using the same, and more specifically, to a technique for identifying error characteristics of a NAND flash memory, characterizing the error characteristics as new parameters, and utilizing the same.

DESCRIPTION OF THE RELATED ART

Semiconductor memories are classified into volatile memories and non-volatile memories according to information storage mechanisms. Volatile memories include a DRAM and an SRAM, which have high reading and writing speeds but lose memory information when power supply is cut off. On the other hand, non-volatile memories are used to store data to be preserved regardless of whether or not power is supplied because they can preserve stored information even if power is cut off. Such non-volatile memories include an EPROM, an EEPROM, an FRAM, a PRAM, an MRAM, and a flash memory. In particular, the flash memory is widely used as an audio and video data storage medium of information devices such as computers, smartphones, digital cameras, voice recorders, and camcorders.

In particular, a NAND flash memory is widely used as a core element of non-volatile memories, but it has limitations in the number of times of data erasure, bad blocks generated during production, a complicated erase operation that must be performed before writing, and the like, and thus it cannot be used as a single element and constitutes a storage device combined with a memory controller.

For storage devices such as solid state drives (SSDs), particularly enterprise SSDs, maximization of QoS is very important for product competitiveness. When a NAND flash memory error occurs in a situation where a host requests data write and read operations, a controller performs various operations to solve the problem or recover data, which causes serious QoS degradation. In order to prevent such QoS degradation, a storage device uses a method of checking the state of a NAND flash memory block before data is written or read and taking preemptive measures. For example, a memory controller records the write and erase counts of memory blocks to prevent the product from being used longer than the lifespan thereof or to prevent the lifespan and performance of the product from being deteriorated due to an imbalance in erase counts of blocks. As another example, in case of a read disturb error, the number of times of reading requested for a block is recorded and data is moved to a new block before reading is performed by a number of times of a threshold value or more such that the error does not occur. In case of a retention error, which is another major error in the NAND flash memory, the degree to which data is affected by this error varies according to the time at which the data is programmed and the temperature at which the data is exposed, and thus it is complicated to track this error. The storage device preemptively copes with the retention error by tracking a data writing time and temperature change and transferring the data to a new block before a degree to which the data is affected by the retention error exceeds a threshold value such that the degree does not exceed the threshold value while power is supplied.

Most of such NAND flash memory errors are identified at the time when a requested NAND flash memory operation is performed, or whether or not an error occurs can be predicted according to a degree to which the operation has been performed. Accordingly, if the memory controller tracks and stores information on errors while power is supplied, the stored information can be used even if power is cut off and then re-supplied. This provides an opportunity to minimize QoS degradation by continuously preemptively coping with errors.

However, in the case of the retention error, factors affecting error occurrence, that is, a time elapsed after programming and an exposure temperature, cannot be tracked while power is cut off. Therefore, in a device that is powered off and then turned on again, there is little chance of preemptively coping with the retention error because a degree to which data is affected by the retention error cannot be ascertained. In particular, NAND flash memory blocks greatly affected by the retention error need to be recovered by the controller using a complicated method, and thus QoS significantly decreases.

SUMMARY OF THE INVENTION

Therefore, the present invention has been made in view of the above problems, and it is an object of the present invention to provide a method of characterizing errors in a NAND flash memory by parameterizing a center distance between patterns in a threshold voltage distribution of NAND flash memory cells to characterize an error source of the NAND flash memory.

In addition, another object of the present invention is to provide a technique for utilizing error information on a NAND flash memory characterized by the aforementioned method.

A method of characterizing an error in a NAND flash memory according to an embodiment of the present invention characterizes an error source of the NAND flash memory using a center distance between one pattern and another pattern among a plurality of patterns in a threshold voltage distribution of NAND flash memory cells as a parameter.

Furthermore, in the method of characterizing an error in a NAND flash memory according to an embodiment of the present invention, the characterized error source of the NAND flash memory may be at least one of a retention, a read disturbance, or a cross temperature.

Furthermore, in the method of characterizing an error in a NAND flash memory according to an embodiment of the present invention, when the NAND flash memory cells are multi-level cells (MLCs) having an erase state ER and first to third programmed states P1 to P3 in order of increasing threshold voltage, the parameter may be a center distance between a first pattern corresponding to the first programmed state and a second pattern corresponding to the third programmed state, and the error source of the NAND flash memory is the retention.

Furthermore, in the method of characterizing an error in a NAND flash memory according to an embodiment of the present invention, when the NAND flash memory cells are triple level cells (TLCs) having an erase state ER and first to seventh programmed states P1 to P7 in order of increasing threshold voltage, the parameter is a center distance between a first pattern corresponding to the third programmed state and a second pattern corresponding to the seventh programmed state, and the error source of the NAND flash memory is the retention.

Furthermore, in the method of characterizing an error in a NAND flash memory according to an embodiment of the present invention, when the NAND flash memory cells are quadruple level cells (QLCs) having an erase state ER and first to fifteenth programmed states P1 to P15 in order of increasing threshold voltage, the parameter is a center distance between a first pattern corresponding to the sixth programmed state and a second pattern corresponding to the fifteenth programmed state, and the error source of the NAND flash memory is the retention.

Furthermore, in the method of characterizing an error in a NAND flash memory according to an embodiment of the present invention, when the NAND flash memory cells are triple level cells (TLCs) having an erase state ER and first to seventh programmed states P1 to P7 in order of increasing threshold voltage, the parameter is a center distance between a first pattern corresponding to the first programmed state and a second pattern corresponding to any one of the second to fourth programmed states, and the error source of the NAND flash memory is the read disturbance.

Furthermore, in the method of characterizing an error in a NAND flash memory according to an embodiment of the present invention, the parameter may be applied to the error source of the NAND flash memory for each program/erase (P/E) cycle.

Furthermore, in the method of characterizing an error in a NAND flash memory according to an embodiment of the present invention, the parameter may be calculated on the basis of an accumulated number of NAND flash memory cells.

An error estimation method according to an embodiment of the present invention estimates a retention error of a memory system using error characterization information of a NAND flash memory generated by the method of characterizing an error in a NAND flash memory according to an embodiment of the present invention.

A storage device control method according to an embodiment of the present invention controls a storage device on the basis of a retention error estimated by the error estimation method according to an embodiment of the present invention.

Features and advantages of the present invention will become more apparent from the following detailed description in conjunction with the accompanying drawings.

Prior to this, the terms or words used in this specification and claims should not be interpreted in a conventional and dictionary sense and should be interpreted as having a meaning and concept consistent with the technical idea of the present invention based on the principle that the inventor can appropriately define the concept of the terms in order to explain the invention in the best way.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
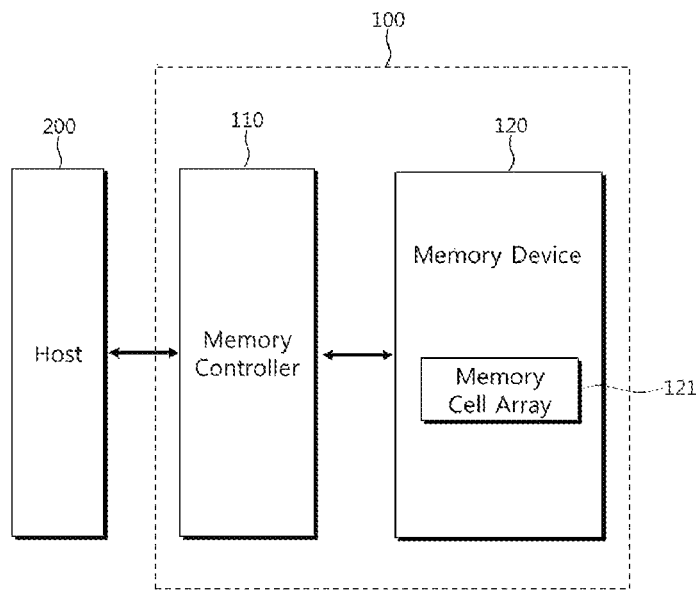
FIG. 1 is a configuration diagram of a storage device.

Objects, specific advantages and novel features of the present invention will become more apparent from the following detailed description and preferred embodiments taken in conjunction with the accompanying drawings. In adding reference numerals to components of each drawing in this specification, it should be noted that the same components have the same reference numerals as much as possible, even if they are shown in different drawings. In addition, terms such as "first" and "second" are used to distinguish one component from another component, and components are not limited by the terms. Hereinafter, in describing the present invention, a detailed description of related known technologies that may unnecessarily obscure the subject matter of the present invention will be omitted.

Hereinafter, preferred embodiments of the present invention will be described in detail with reference to the accompanying drawings.

Figure 2:
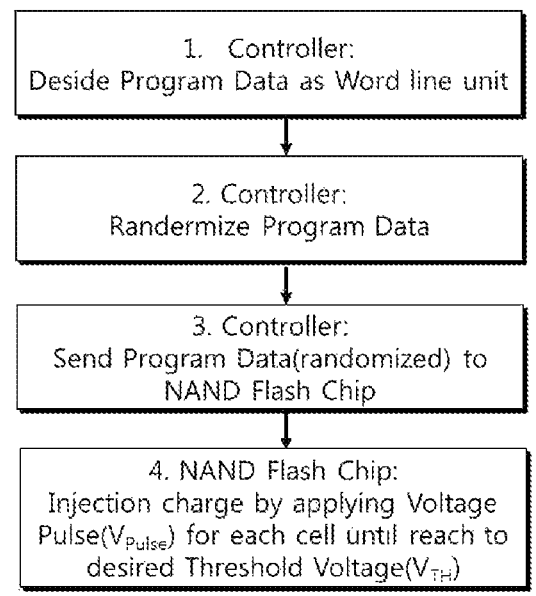
FIG. 2 is a flowchart illustrating a programming process of the storage device.
Figure 3:
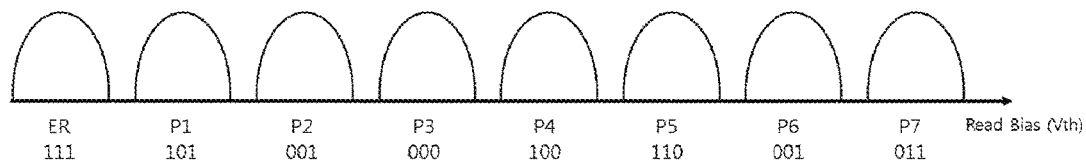
FIG. 3 shows a threshold voltage distribution of NAND flash memory cells (TLC)
Figure 4:
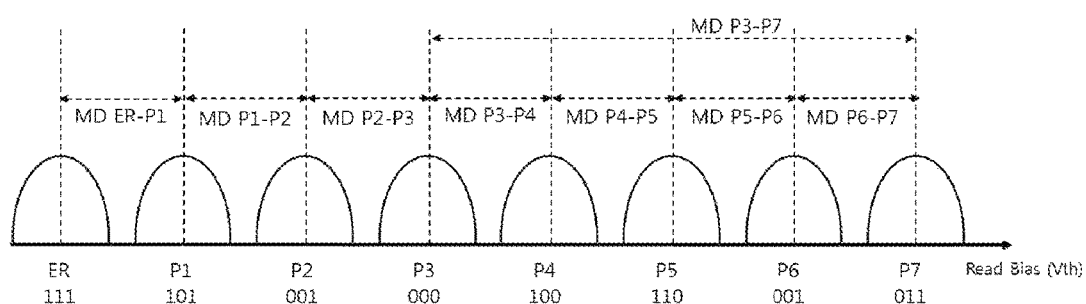
FIG. 4 shows a threshold voltage distribution of NAND flash memory cells (TLC) for illustrating parameters according to an embodiment of the present invention.
Figure 5:
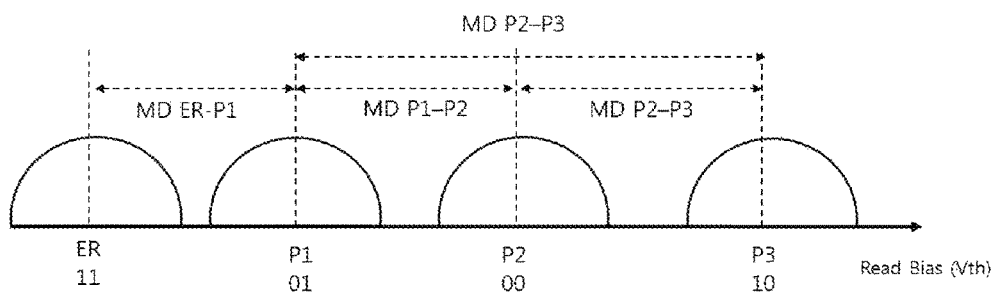
FIG. 5 shows a threshold voltage distribution of NAND flash memory cells (MLC) for illustrating parameters according to an embodiment of the present invention.
Figure 6:
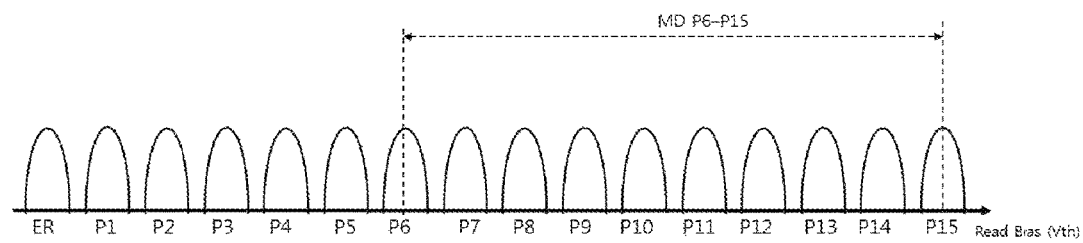
FIG. 6 shows a threshold voltage distribution of NAND flash memory cells (QLC) for illustrating parameters according to an embodiment of the present invention.

FIG. 1 is a configuration diagram of a storage device, FIG. 2 is a flowchart illustrating a programming process of the storage device, and FIG. 3 shows a threshold voltage distribution of NAND flash memory cells (TLC). FIG. 4 shows a threshold voltage distribution of NAND flash memory cells (TLC) for illustrating parameters according to an embodiment of the present invention, FIG. 5 shows a threshold voltage distribution of NAND flash memory cells (MLC) for illustrating parameters according to an embodiment of the present invention, and FIG. 6 shows a threshold voltage distribution of NAND flash memory cells (QLC) for illustrating parameters according to an embodiment of the present invention.

A method of characterizing errors in a NAND flash memory according to an embodiment of the present invention is performed by a computing device, and characterizes an error source of the NAND flash memory using, as a parameter, a center distance between one pattern and another pattern among a plurality of patterns in a threshold voltage distribution of NAND flash memory cells.

The present invention relates to a technique for identifying error characteristics of a NAND flash memory, characterizing the error characteristics as new parameters, and utilizing the same. For storage devices such as solid state drives (SSDs), particularly enterprise SSDs, maximization of QoS is very important for product competitiveness. Since NAND flash memory errors are a major factor of QoS degradation in storage devices, it is important to understand various error characteristics of the NAND flash memory and preemptively cope with errors before errors occur. Most NAND flash memory errors are identified at the time when a requested NAND flash memory operation is performed, or whether or not an error occurs can be predicted according to a degree to which the operation has been performed. However, in the case of a retention error, there is little opportunity to preemptively cope with the error because factors affecting the occurrence of the error, that is, the time elapsed after programming and an exposure temperature, cannot be tracked while power is off. In particular, NAND flash memory blocks greatly affected by the retention error need to use a complicated recovery method at the time of reading data, and thus they have a problem of considerable QoS degradation. As a solution to this problem, the present invention has been devised.

Referring to FIG. 1, a storage device 100 includes a memory controller 110 and a memory device 120. The storage device 100 may be used in various computing systems such as smartphones, digital cameras, black boxes, and navigation devices. Here, the memory controller 110 and the memory device 120 may be provided as a single chip, package, or module, but are not necessarily limited thereto.

The memory controller 110 may receive a data operation request and an address from a host 200 through an interface and exchange data with the host 200. In addition, the memory controller 110 may control data read, write, and erase operations of the memory device 120 in response to a request of the host 200.

The memory device 120 may include at least one memory cell array 121. The memory cell array 121 may include a plurality of memory cells in regions where a plurality of wordlines and bitlines intersect, and the memory cells are non-volatile memory cells which may be 2-bit multilevel cells (MLCs) storing 2 bits of data, triple level cells (TLCs) storing 3 bits of data, quadruple level cells (QLCs) storing 4 bits of data, or multi-level cells storing 5 or more bits of data. Here, all of the plurality of nonvolatile memory cells do not necessarily have to be any one of MLC, TLC, and QLC and may be different multi-level cells such that some may be MLCs and others may be TLCs. The memory device 120 may include a NAND flash memory.

Referring to FIGS. 2 and 3, in a process of programming the storage device, the memory controller determines data to be programmed in wordline units, which are minimum program units of the NAND flash memory, in response to a write request from the host. Next, the memory controller randomizes the data to be programmed in wordline units. Here, data is processed such that memory cells connected to one wordline have the same ratio of programmed states. For example, in the case of TLC in which each memory cell connected to one wordline stores 3 bits of data, data can be randomized such that each memory cell has any one of an erase state (ER) and first to seventh programmed states P1 to P7. Thereafter, the memory controller sends the data to be programmed to a NAND flash memory chip, and the NAND flash memory chip injects electrons by applying voltage pulses $V_{Pulse}$ until each memory cell is set to a desired threshold voltage Vth. Accordingly, in the case of TLC, a threshold voltage distribution of a programmed wordline is composed of eight patterns corresponding to the erase state to the seventh programmed state ER to P7 in order of increasing threshold voltage. The horizontal axis of the threshold voltage distribution of memory cells represents the threshold voltage, the vertical axis represents the number of memory cells, and the threshold voltage distribution represents that the amount of injected electrons increases from the erase state to the seventh programmed state.

The present invention characterizes an error source of the NAND flash memory by using, as a parameter, a center distance between one pattern and another pattern among a plurality of patterns within the threshold voltage distribution of the NAND flash memory cells. Here, the error source may be at least one of retention, read disturbance, or a cross temperature that cause errors in the NAND flash memory.

The retention error causes an error in stored data due to gradual decrease in memory cell charges that have already been written. This retention error is affected by a time elapsed after programming, that is, a retention time, and an exposure temperature. Since the retention error causes a decrease in the threshold voltage, patterns in the threshold voltage distribution shift to the left, that is, toward the erase state.

The read disturb error refers to a change in the threshold voltage due to the influence of a voltage on adjacent cells located in the same block as relevant cells in the process of reading the flash memory. The degree of influence of this read disturbance increases according to a programmed data read count.

When there is a difference between a temperature at the time of programming into memory cells and a temperature at which a read operation is performed, the threshold voltage may vary, and thus an error may be induced in the flash memory even by a cross temperature.

The present invention uses novel parameters in order to characterize such NAND flash memory error sources. A parameter according to the present invention is determined as a center distance between patterns in a threshold voltage distribution of memory cells. Here, a center distance refers to a distance between the centers of one pattern and another pattern among a plurality of patterns within a threshold voltage distribution.

In FIG. 4 showing a threshold voltage distribution of TLCs, the center distance between two patterns respectively corresponding to the erase state ER and the first programmed state P1 is represented by "MD ER-P1" and the center distance between two patterns respectively corresponding to the first programmed state P1 and the second programmed state P2 is represented by "MD P1-P2." When NAND flash memory cells are TLCs, the parameter according to the present invention may be the center distance MD P3-P7 between a first pattern corresponding to the third programmed state P3 and a second pattern corresponding to the seventh programmed state P7, and the error source may be retention. However, the parameter is not necessarily limited to this, and as another example, may be the center distance MD P4-P7 between the first pattern corresponding to the fourth programmed state P4 and the second pattern corresponding to the seventh programmed state P7.

Referring to FIG. 5, when NAND flash memory cells are multi-level cells (MLCs) having an erase state ER and first to third programmed states P1 to P3 in order of increasing threshold voltage, the parameter according to the present invention may be the center distance MD P1-P3 between the first pattern corresponding to the first programmed state P1 and the second pattern corresponding to the third programmed state P3, and the error source may be retention. However, the parameter is not necessarily limited to this, and as another example, may be the center distance MD P2-P3 between the first pattern corresponding to the second programmed state P2 and the second pattern corresponding to the third programmed state P3.

Referring to FIG. 6, when NAND flash memory cells are quadruple-level cells (QLCs) having an erase state ER and first to fifteenth programmed states P1 to P15 in order of increasing threshold voltage, the parameter according to the present invention may be the center distance MD P6-P15 between the first pattern corresponding to the sixth programmed state P6 and the second pattern corresponding to the fifteenth programmed state P15, and the error source may be retention. However, the parameter is not necessarily limited to this, and as another example, may be the center distance MD P7-P15 between the first pattern corresponding to the seventh programmed state P7 and the second pattern corresponding to the fifteenth programmed state P15.

In the case of the retention error, the patterns of the threshold voltage distribution shift to the left. Since this occurs in a cell having a high threshold voltage, such shifting apparently occurs in the pattern corresponding to the third programmed state P3 in the case of MLC, in the pattern corresponding to the seventh programmed state P7 in the case of TLC, and in the pattern corresponding to the fifteenth programmed state P15 in the case of QLC. Accordingly, the present invention characterizes a degree to which the NAND flash memory is affected by the retention error by parameterizing the center distance between patterns of the threshold voltage distribution, which change relatively distinctly with the retention time.

When the retention error is characterized using the center distance between patterns of a threshold voltage distribution as a parameter, the center distance value is determined depending on a retention period. Here, since the retention error is affected by a program/erase (P/E) cycle, the center distance value may be determined depending on a retention period for each P/E cycle.

Meanwhile, the read disturb error affects patterns corresponding to the erase state ER and the first programmed state P1 of the threshold voltage distribution. Therefore, in the case of MLC, the present invention can characterize read disturbance using the center distance between the first pattern corresponding to the first programmed state P1 and the second pattern corresponding to the second programmed state P2 as a parameter. In addition, read disturbance can be characterized by using the center distance between the first pattern corresponding to the first programmed state P1 and the second pattern corresponding to any one of the second to fourth programmed states P2 to P4 as a parameter in the case of TLC, and by using the center distance between the first pattern corresponding to the first programmed state P1 and the second pattern corresponding to any one of the second to seventh programmed states P2 to P7 as a parameter in the case of QLC.

When the read disturbance error is characterized by using the center distance between patterns of the threshold voltage distribution as a parameter, the center distance value is determined according to a read count. Here, since the read disturbance error is also affected by the P/E cycle, the center distance value can be determined according to a read count for each P/E cycle.

In addition, since the cross temperature also causes the patterns of the threshold voltage distribution to shift, a degree to which the NAND flash memory is affected by the cross temperature can be represented using the center distance between patterns of the threshold voltage distribution as a parameter. Here, the center distance value can be determined according to a program temperature and a read temperature. At this time, as described above, the center distance value can be determined according to a program temperature and a read temperature for each P/E cycle.

Here, there may be various methods of determining a center distance value. As an embodiment, bias voltages corresponding to the centers of patterns parameterized in a threshold voltage distribution may be determined, and a center distance value may be determined on the basis of the difference therebetween.

Figure 7:
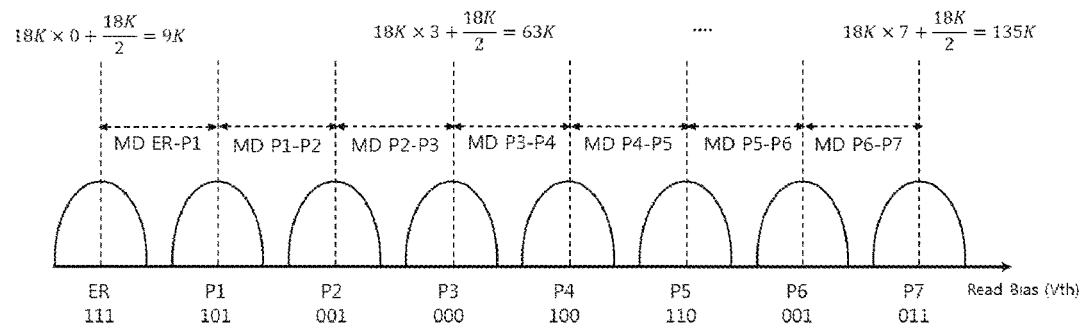
FIG. 7 is a diagram illustrating calculation of parameters according to another embodiment of the present invention when a NAND page size is 18 kB.

In another embodiment, since there is a limitation in obtaining a center distance value through a threshold voltage distribution during operation of a commercial storage device such as an SSD, a center distance value may be determined on the basis of the accumulated number of NAND flash memory cells. Since each pattern has a uniform number of cells in programmed data, a bias corresponding to the center of each pattern can be obtained. For example, in the case of a pattern corresponding to an N-th programmed state (N being a natural number of 1 or more), a bias value corresponding to the center of the pattern is (number of cells of one pattern×N)+(number of cells of one pattern×½). FIG. 7 is a diagram illustrating calculation of parameters according to another embodiment of the present invention when a NAND page size is 18 kB.

Referring to FIG. 7, specifically, the center of the pattern corresponding to the third programmed state P3 may be determined as 18k×3+18k/2=63k, the center of the pattern corresponding to the seventh programmed state P7 may be determined as 18k×7+18k/2=135k, and the difference therebetween may be determined as a center distance value. Setting a center distance value based on the accumulated number of cells in this manner requires less processing overhead than setting the center distance value based on patterns of a threshold voltage distribution. In addition, even when the shape of the threshold voltage distribution is changed due to the influence of read disturbance, retention, and cross temperature and thus it is difficult to determine the center distance between patterns using only the shape, the center distance can be more easily determined.

In the case of characterizing errors in a predetermined NAND flash memory in the above-described manner, error characterization information can be used not only for the corresponding NAND flash memory but also for other NAND flash memories because main error sources of the NAND flash memory do not change.

For example, when power is cut off and then re-supplied to the storage device, it is possible to estimate a degree to which the flash memory is affected by the retention error by obtaining a parameter value used for error characterization for a programmed flash memory block, acquiring P/E cycles, and then matching each value to error characterization information to ascertain a retention period. Although the retention error affects the programmed flash memory block even while power is not supplied to the storage device, factors affecting the error, that is, a time elapsed after programming and an exposure temperature, cannot be tracked using conventional technology. However, when the retention error is characterized according to the present invention, a degree to which the flash memory is affected by the retention error can be estimated using characterized error information when power is cut off and then re-supplied. In one embodiment, a storage system may estimate the retention error affecting a flash memory by estimating and recording the retention error by tracking a programming time and an exposure temperature while power is supplied, estimating a degree to which a last programmed block is affected by the retention error through error characterization information when power is cut off and then re-supplied, and subtracting a degree of the influence of the retention error while power is supplied therefrom. For all blocks, the estimated retention error may be added to the retention error affecting the flash memory before power is cut off to track a degree to which all blocks are affected by the retention error.

In addition, since error characterization information quantifies a degree to which retention is accelerated for each P/E cycle, a policy differentiated for retention for each P/E cycle can be used to set a threshold value.

Meanwhile, the operation of the storage device may be controlled on the basis of the estimated retention error. The storage device may estimate the retention error when power is cut off and then supplied as described above, and preemptively improve QoS on the basis of the estimated retention error.

The storage device may estimate the retention error when power is cut off and then supplied, and may refresh a block in which the estimated value exceeds a threshold value as a new block. In addition, the storage device may estimate a degree of influence of the retention error after power is cut off and then supplied and perform a read operation using an appropriate read bias. Further, the storage device may estimate a degree of influence of the retention error after power is cut off and then supplied, and if the degree is significant, may immediately perform soft decoding without hard decoding. In addition, the storage device may determine an optimal read bias to be applied during read retry by estimating a degree of influence of the retention error. Furthermore, in order to determine whether a block in which a BER is high or UECC occurs is caused by the retention error before registering the block as a grown-bad block and isolating the same, the storage device may estimate whether it is affected by the retention error and use the estimation result such that the block is not misjudged as a grown-bad block.

Hereinafter, the present invention will be described in more detail through specific experimental examples.

1. Characterization Process 1.1. Overview of Characterization Process

The NAND flash memory used in this experimental example is a 128-layer 3D TLC NAND flash memory for enterprise from a major NAND flash memory manufacturer, the P/E cycle limit is 11k in a TLC mode, and a permitted maximum read count is 1M. This experimental example was performed on a commercial SSD based on the latest ASIC.

In order to check each error characteristic according to the P/E cycle, experiments were performed using one SSD per P/E cycle 1k. A total of 14 SSDs were used at intervals of 1k from 0k to 13k with a 2k margin from the endurance specifications described in the NAND flash memory. The number of used sample blocks is different for each characterization process due to a difference in execution time, which will be described in each characterization process below. In order to draw a threshold voltage distribution (Vth distribution) by sampling only a small number of wordlines WL in one block, the influence of applied additional read disturbance was maintained as a reasonable level. The process of increasing the P/E cycle complied with "Intentional delays between cycles" described in "JESD22-A117" and was performed at room temperature.

1.2. Read Disturb Error Characterization Process

In read disturbance characterization, 256 sample blocks per P/E cycle were used and the process was performed at room temperature. All wordlines in the blocks were evenly read and a threshold voltage distribution was drawn every time the cumulative read count of the blocks increased by 0.1M. By repeating this 20 times, the read operation was performed up to 2M times.

1.3. Reception Error Characterization Process Retention error characterization was performed using 6400 sample blocks per P/E cycle and was conducted on the basis of the enterprise standard among "Application Classes" described in "JESD218B" which is JEDEC requirements that enterprise SSDs need to satisfy. Active use means that power is supplied all day long at an ambient temperature of 55° C. for 24 hours a day while the power is on, and retention use means that the temperature is maintained at 40° C. without power being supplied. In the case of enterprise SSDs, JEDEC requires that programmed data guarantee UBER 10-16 for up to 3 months when stored at 40° C. or less in a power-off state. Here, in order to accelerate a retention state, "Calculations of Temperature-Accelerated Stress Times" described in "JESD218B" was applied to a period in which acceleration was required.

In the case of retention error characterization, data was maintained in the active use state for 0 to 14 days after data programming. Among the days, a threshold voltage distribution of each block was extracted once a day at an ambient of 55° C. in real time for 0 to 7 days. Backing was performed by applying accelerated stress times for 7 to 14 days, and a threshold voltage distribution was extracted once at an ambient of 55° C. on the 4th day. Experiments were performed by applying "Accelerated Stress Time" under retention power use condition for 14 days to 5 months, and a threshold voltage distribution was extracted once on a basis of 3/3.5/4/5 months. Details are summarized in Table 1 below.

TABLE 1

| Retention Use Time | Condition | Temperature | Temperature-Accelerated Stress Times | |
|---|---|---|---|---|
| 0 day | Active Use | 55° C. | 0 day | 55° C. |
| 1 day | Active Use | 55° C. | 1 day | 55° C. |
| 2 day | Active Use | 55° C. | 1 day | 55° C. |
| 3 day | Active Use | 55° C. | 1 day | 55° C. |
| 3 day | Active Use | 55° C. | 1 day | 55° C. |
| 4 day | Active Use | 55° C. | 1 day | 55° C. |
| 5 day | Active Use | 55° C. | 1 day | 55° C. |
| 6 day | Active Use | 55° C. | 1 day | 55° C. |
| 7 day | Active Use | 55° C. | 1 day | 55° C. |
| 14 day | Active Use | 55° C. | 1 day | 72.5° C. |

TABLE 1-continued

| Retention Use Time | Condition | Temperature | Temperature-Accelerated Stress Times | |
|---|---|---|---|---|
| 90 day(3.0 month) | Retention Use | 40° C. | 1 + 1 day | 55° C. (1 day) + 58.9° C. (1 day) |
| 105 day(3.5 month) | Retention Use | 40° C. | 1 day | 64.0° C. |
| 120 day(4.0 month) | Retention Use | 40° C. | 1 day | 64.0° C. |
| 150 day(5.0 month) | Retention Use | 40° C. | 1 day | 71.7° C. |

1.4. Cross Temperature Characterization Process

In cross temperature characterization, 640 sample blocks were used per P/E cycle. Since the cross temperature is not affected by the ambient temperature but by the temperature of a NAND flash chip, the process was performed while varying the temperature of the NAND flash chip. In order to precisely control the temperature of the NAND flash chip, temperature control was performed in such a manner that the temperature provided by the NAND flash chip was monitored, an arbitrary block other than the sample blocks was selected and NAND IO was performed thereon such that the temperature reached a reference temperature when the temperature was lower than the reference temperature, and the temperature was lowered by operating an external fan when the temperature was higher than the reference temperature. As shown in Table 2 below, a program temperature was controlled in units of 5° C. from 35° C. to 75° C., and a threshold voltage distribution was extracted by controlling a read temperature in units of 5° C. from 35° C. to 75° C. after P/E was performed at the corresponding temperature, as shown in Table 2. In this process, the threshold voltage distribution was drawn within several minutes after programming to prevent occurrence of retention.

TABLE 2

| Program Temperature | Read Temperature | | | | | | | | |
|---|---|---|---|---|---|---|---|---|---|
| 35° C. | 35° C. | 40° C. | 45° C. | 50° C. | 55° C. | 60° C. | 65° C. | 70° C. | 75° C. |
| 40° C. | 35° C. | 40° C. | 45° C. | 50° C. | 55° C. | 60° C. | 65° C. | 70° C. | 75° C. |
| 45° C. | 35° C. | 40° C. | 45° C. | 50° C. | 55° C. | 60° C. | 65° C. | 70° C. | 75° C. |
| 50° C. | 35° C. | 40° C. | 45° C. | 50° C. | 55° C. | 60° C. | 65° C. | 70° C. | 75° C. |
| 55° C. | 35° C. | 40° C. | 45° C. | 50° C. | 55° C. | 60° C. | 65° C. | 70° C. | 75° C. |
| 60° C. | 35° C. | 40° C. | 45° C. | 50° C. | 55° C. | 60° C. | 65° C. | 70° C. | 75° C. |
| 65° C. | 35° C. | 40° C. | 45° C. | 50° C. | 55° C. | 60° C. | 65° C. | 70° C. | 75° C. |
| 70° C. | 35° C. | 40° C. | 45° C. | 50° C. | 55° C. | 60° C. | 65° C. | 70° C. | 75° C. |
| 75° C. | 35° C. | 40° C. | 45° C. | 50° C. | 55° C. | 60° C. | 65° C. | 70° C. | 75° C. |

2. Characterization Results 2.1. Read Disturb Error Characterization Results

The degree of influence of read disturbance increases according to a programmed data read count. In a NAND flash memory read process, a read reference voltage $V_{Ref}$ is applied to a read target wordline and a pass-through voltage $V_{pass}$ is applied to wordlines other than the read target wordline at the time of reading one page in a block. Since $V_{pass}$ is not a negligibly low voltage, the same effect as supplying a voltage pulse $V_{Pulse}$ for programming is obtained in some memory cells.

Figure 8:
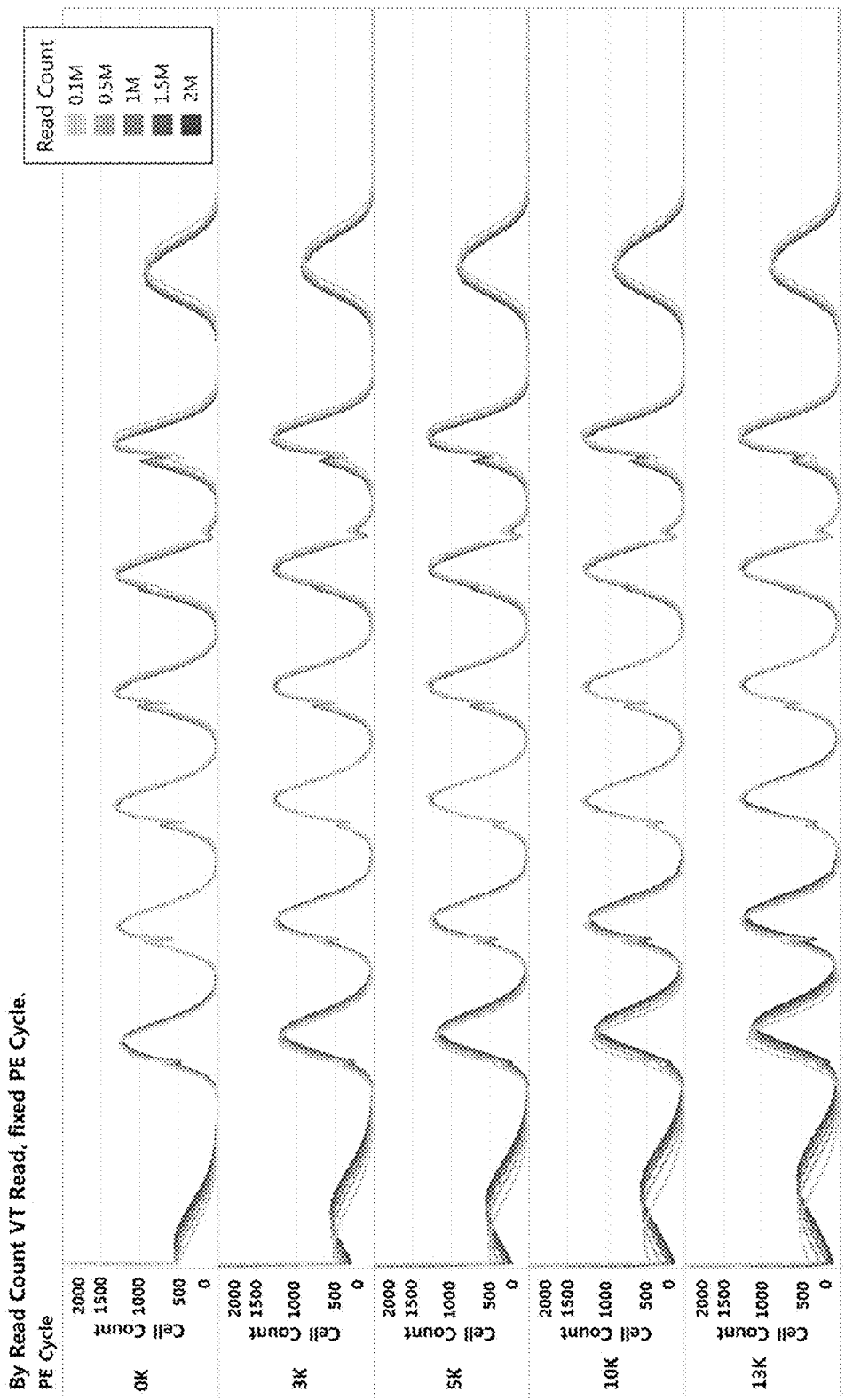
FIG. 8 shows threshold voltage distributions of NAND flash memory cells (TLC) according to a read count for each program/erase (P/E) cycle according to an experimental example.

FIG. 8 shows threshold voltage distributions of NAND flash memory cells (TLC) according to a read count for each P/E cycle according to an experimental example. The threshold voltage distributions are obtained as a read count is increased at P/E cycles of 0k, 3k, 5k, 10k, and 13k of an actual NAND flash memory. It can be seen that a pattern corresponding to an erase state ER at each P/E cycle shifts to the right as the read count increases. This is because cells in the erase state ER and the first programmed state P1 have been programmed due to $V_{Pass}$. It can be seen that patterns that are far from the pattern in the erase state ER have little change or shift to the left. This is because programming to a higher potential than those in the erase state ER and the first programmed state P1 is not performed due to read disturbance, and shifting to the left is caused by the influence of the retention error over time during read disturbance.

Figure 9:
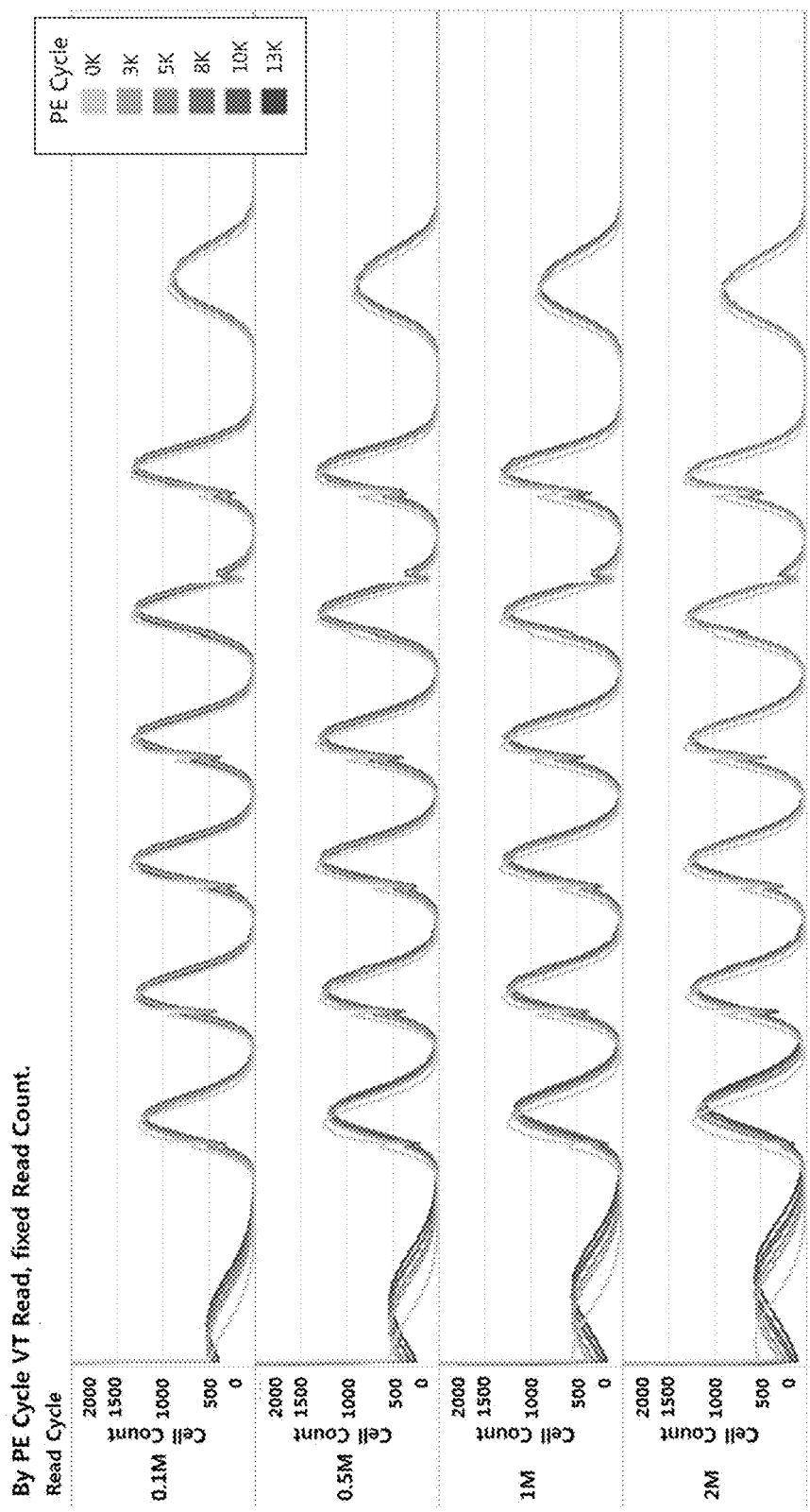
FIG. 9 shows threshold voltage distributions of NAND flash memory cells (TLC) according to a program/erase (P/E) cycle for each read count according to an experimental example.

FIG. 9 shows threshold voltage distributions of NAND flash memory cells (TLC) according to a program/erase (P/E) cycle for each read count according to an experimental example. Referring to this, it can be ascertained that patterns corresponding to the erase state ER and the first programmed state P1 are more affected by read disturbance as the P/E cycle increases even though the same read operation is performed. This is because the NAND flash memory's ability to confine electrons decreases as the P/E cycle increases, making programming easier.

2.2. Retention Error Characterization Results

The retention error is an error in which charges of a programmed cell leak according to an elapsed time after programming and an exposure temperature. This causes patterns to shift to the left in a threshold voltage distribution. This occurs in a cell having a high threshold voltage in a 3D NAND flash memory, and thus the degree of the retention error becomes severe from the seventh programmed state P7.

Figure 10:
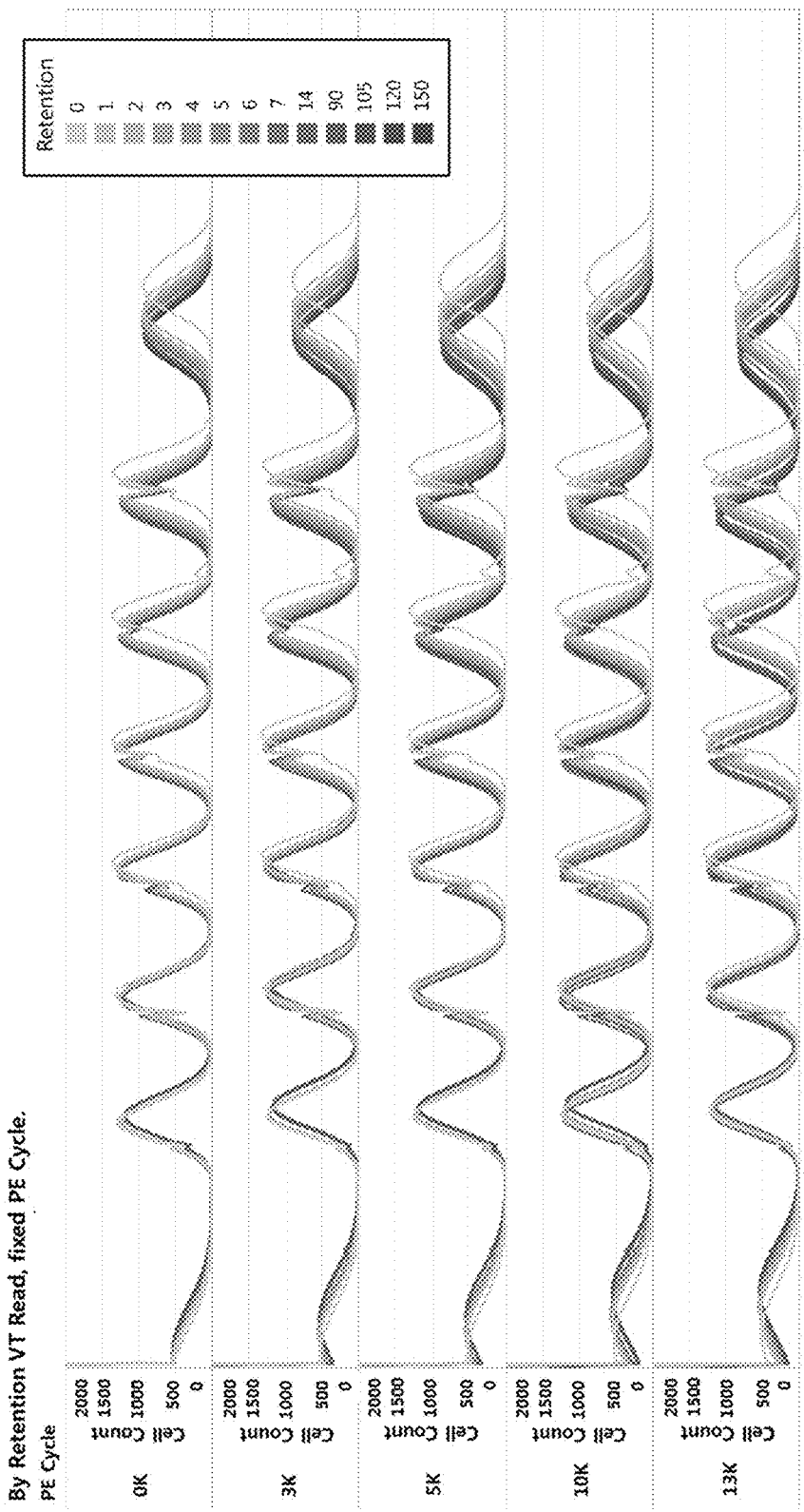
FIG. 10 shows threshold voltage distributions of NAND flash memory cells (TLC) according to retention days for each P/E according to an experimental example.

FIG. 10 shows threshold voltage distributions of NAND flash memory cells (TLC) according to retention days for each P/E cycle according to an experimental example. Here, retention is the number of days that have elapsed since programming conforming to retention conditions. Referring to FIG. 10, it can be ascertained that patterns corresponding to the erase state ER shift to the right due to read disturbance caused by reading performed to obtain threshold voltage distribution rather than retention. In addition, it can be ascertained that as the retention increases, patterns corresponding to the third to seventh programmed states P3 to P7 shift to the left, the patterns corresponding to the seventh programmed state P7 have the highest shifting degree, and patterns on the left have lower shifting degrees.

Figure 11:
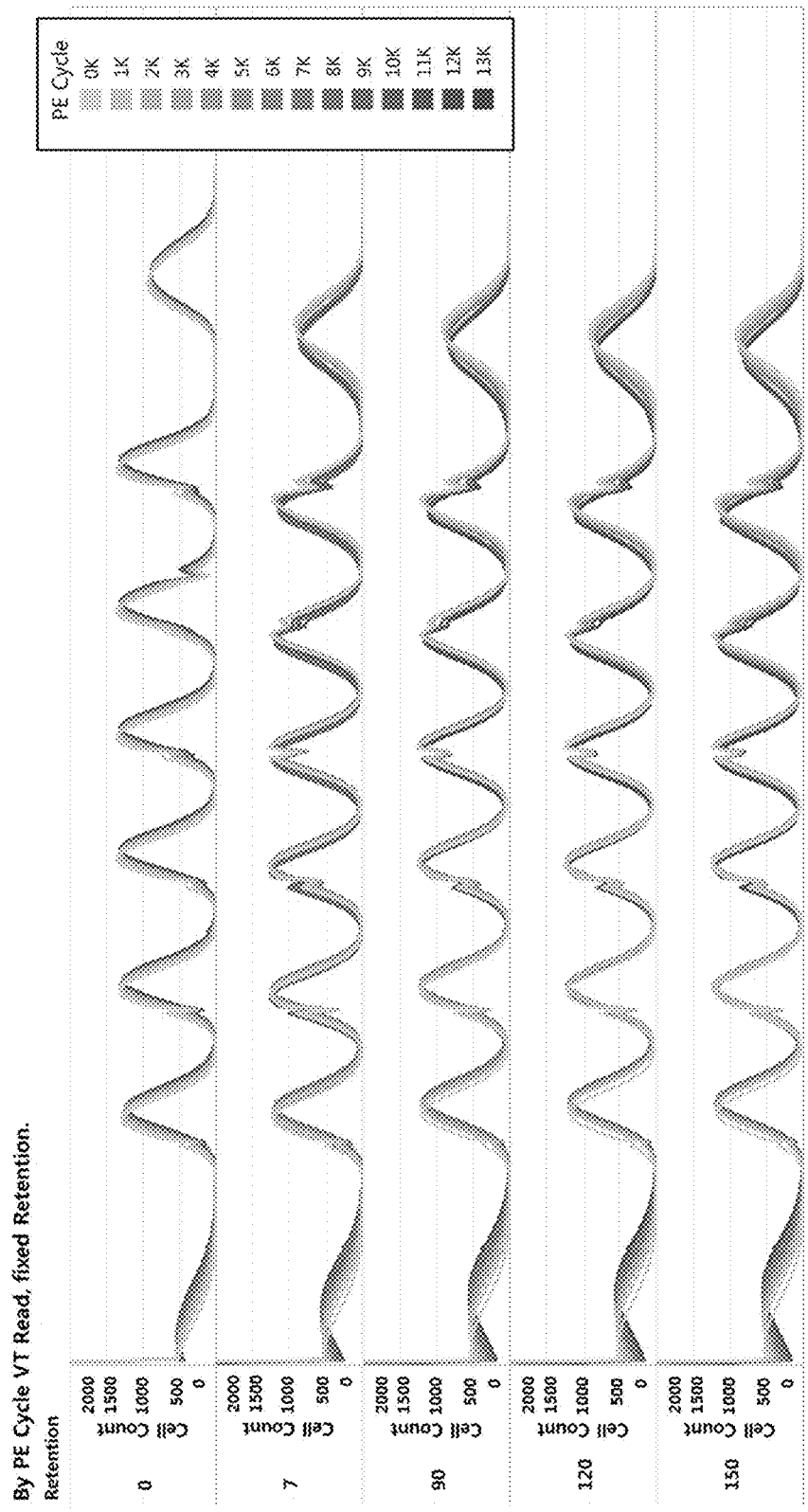
FIG. 11 shows threshold voltage distributions of NAND flash memory cells (TLC) according to a P/E cycle for each retention day according to an experimental example.

FIG. 11 shows threshold voltage distributions of NAND flash memory cells (TLC) according to a P/E cycle for each retention day according to an experimental example. Referring to FIG. 11, it can be ascertained that, even if memory cells are influenced by the same retention, the degree of influence increases as the P/E cycle increases. This is because the ability to store electrons decreases as the P/E cycle increases.

2.3. Cross Temperature Characterization Results

Figure 12:
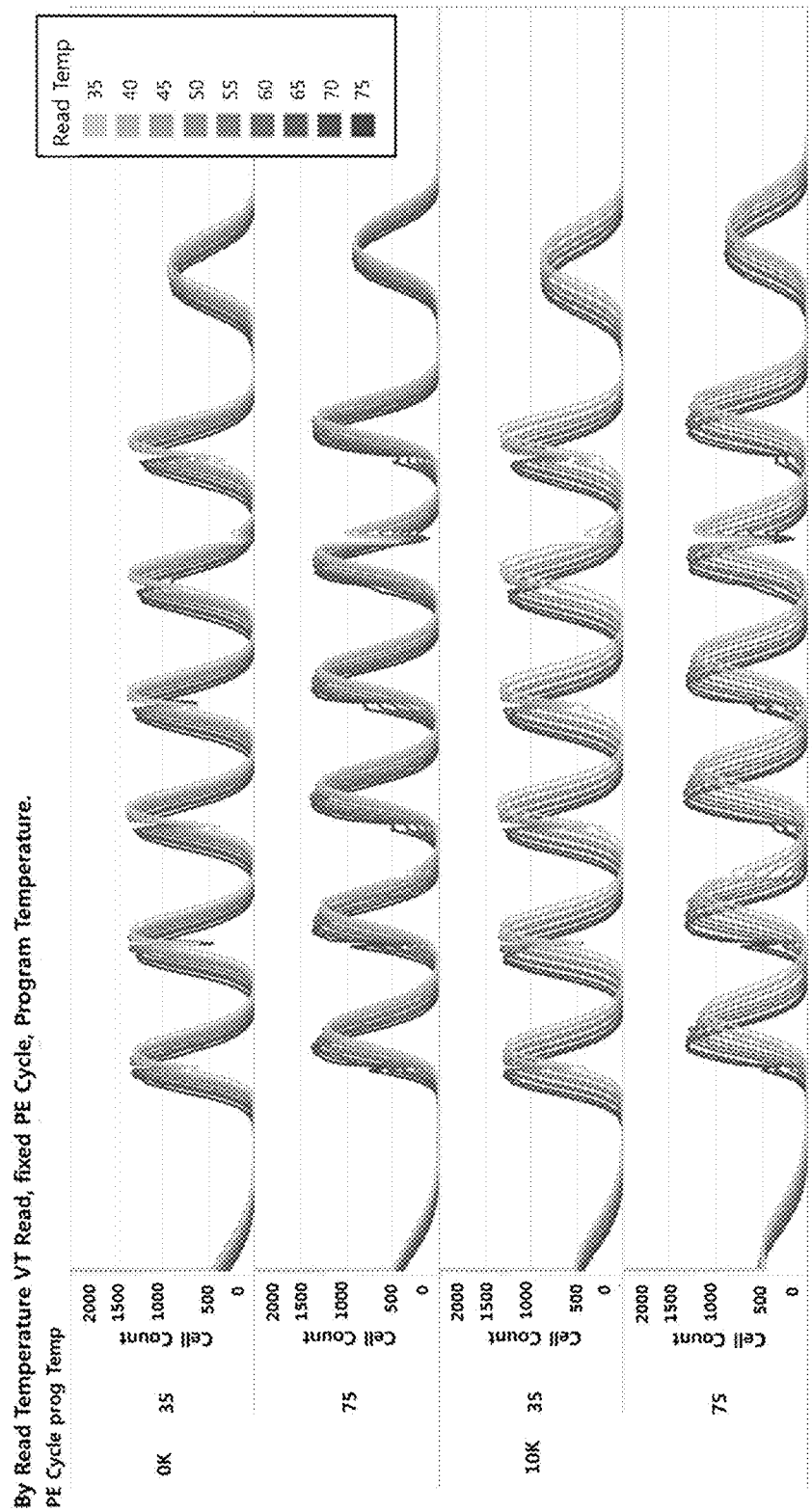
FIG. 12 shows threshold voltage distributions of NAND flash memory cells (TLC) according to a read temperature for each P/E cycle according to an experimental example (in case of a fixed program temperature)

FIG. 12 shows threshold voltage distributions of NAND flash memory cells (TLC) according to a read temperature for each P/E cycle according to an experimental example (in the case of a fixed program temperature). Referring to FIG. 12, it can be ascertained that all patterns of the threshold voltage distributions shift to the left as the temperature at which wordlines programmed at the same temperature are read increases regardless of the P/E cycle.

Figure 13:
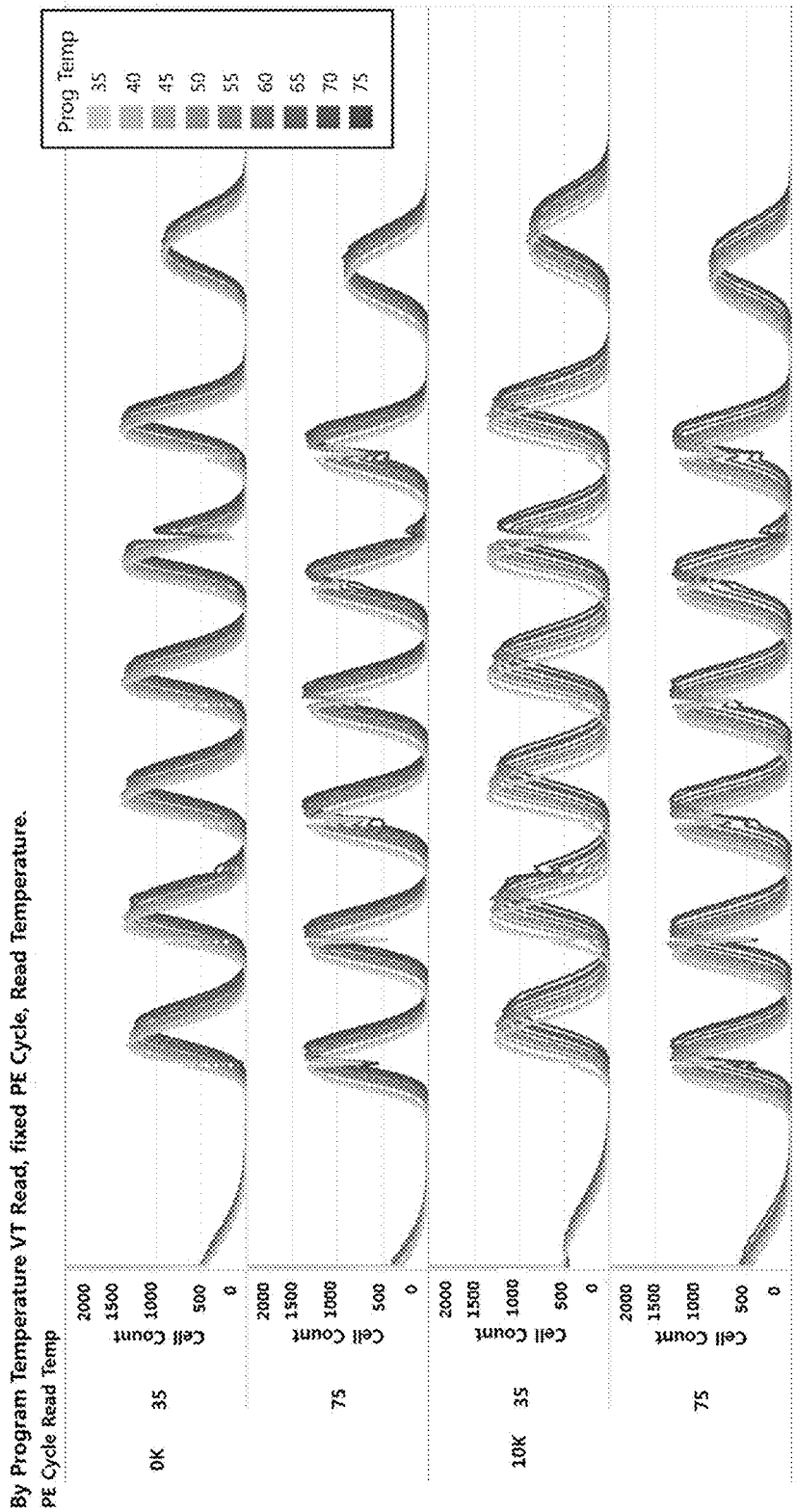
FIG. 13 shows threshold voltage distributions of NAND flash memory cells (TLC) according to a program temperature for each P/E cycle according to an experimental example (in case of a fixed read temperature).

FIG. 13 shows threshold voltage distributions of NAND flash memory cells (TLC) according to a program temperature for each P/E cycle according to an experimental example (in the case of a fixed read temperature). Referring to FIG. 13, it can be ascertained that all patterns of the distributions shift to the right as the program temperature increases regardless of the P/E cycle.

As can be ascertained from FIGS. 12 and 13, the cross temperature does not affect only some patterns of a threshold voltage distribution, and the entire distribution shifts to the left/right according to temperature change.

3. Error Estimation

In this experimental example, the center distance MD P3-P7 between patterns corresponding to the third programmed state P3 and the seventh programmed state P7 was parameterized according to the above-described method of using the center distance between patterns of a threshold voltage distribution as a parameter. Although parameters can be applied in various pattern sections, MD P3-P7, which causes the most accurate retention error estimation result, was applied.

In this experimental example, MD P3-P7 was obtained and parameterized for each error type. The value represents a threshold voltage distribution of a 128-layer 3D NAND flash memory used in this experimental example in units of ticks. Although the value may vary depending on the manufacturer of the NAND flash memory and products, parameterization can be performed for each NAND flash memory product by performing the above-described characterization process in the same manner. Since main error sources of a 3D or 4D NAND flash memory do not change, the present invention can be applied to other NAND flash memories.

As shown in Table 3 below, it is possible to ascertain a degree to which a NAND flash memory block has been affected by retention using the retention MD P3-P7 parameter without tracking the time at which the NAND flash memory block has been programmed and the temperature at which the NAND flash memory block has been exposed. Even if power is cut off and then re-supplied, the degree of retention error can be ascertained by obtaining MD P3-P7 of the programmed block, identifying the P/E cycle, and finding this value in Table 3. MD P3-P7 values according to retention days for each P/E cycle are written in Table 3. Since other major error sources of the NAND flash memory do not affect MD P3-P7, the retention error can be estimated using this method.

TABLE 3

| | | PE Cycle | | | | | | | | | | | |
|---|---|---|---|---|---|---|---|---|---|---|---|---|---|
| Retention (Day) | | 0 | 1K | 2K | 3K | 5K | 6K | 7K | 8K | 9K | 10K | 12K | 13K |
| Active Use | 0 | 170 | 170 | 170 | 170 | 170 | 170 | 170 | 170 | 170 | 170 | 170 | 170 |
| | 1 | 165 | 164 | 164 | 164 | 163 | 163 | 163 | 163 | 162 | 162 | 162 | 162 |
| | 2 | 164 | 163 | 162 | 162 | 161 | 161 | 161 | 161 | 160 | 160 | 160 | 160 |
| | 3 | 163 | 162 | 161 | 161 | 160 | 160 | 160 | 160 | 159 | 159 | 159 | 159 |
| | 4 | 162 | 161 | 161 | 160 | 159 | 159 | 159 | 159 | 158 | 158 | 158 | 158 |
| | 5 | 162 | 160 | 160 | 159 | 159 | 159 | 158 | 158 | 157 | 157 | 157 | 157 |
| | 6 | 161 | 160 | 159 | 159 | 158 | 158 | 158 | 157 | 156 | 156 | 156 | 156 |
| | 7 | 161 | 159 | 159 | 158 | 157 | 157 | 157 | 157 | 156 | 156 | 156 | 156 |
| | 14 | 159 | 158 | 157 | 156 | 156 | 156 | 155 | 155 | 154 | 154 | 154 | 153 |
| Retention Use | 90 | 158 | 157 | 156 | 155 | 155 | 155 | 154 | 154 | 152 | 152 | 153 | 152 |
| | 105 | 158 | 156 | 155 | 155 | 154 | 154 | 153 | 153 | 152 | 152 | 152 | 152 |
| | 120 | 157 | 155 | 155 | 154 | 153 | 153 | 153 | 152 | 151 | 151 | 151 | 151 |
| | 150 | 157 | 155 | 154 | 154 | 152 | 152 | 152 | 152 | 150 | 150 | 150 | 150 |

The cross temperature changes the threshold voltage of each cell according to a program temperature and a read temperature, as shown in the characterization results, and consequently shifts a threshold voltage distribution to the left/right. However, it can be ascertained from Table 4 that the cross temperature does not affect MD P3-P7 even if it affects the threshold voltage distribution. Referring to Table 4, it can be ascertained that MD P3-P7 measured while changing the P/E cycle from 0k to 13k, changing the program temperature from 35° C. to 75° C., and changing the read temperature from 35° C. to 75° C. are parameterized and changed within a maximum of 1 tick.

TABLE 4

| Temperature | | PE Cycle | | | | | | | | | | | | |
|---|---|---|---|---|---|---|---|---|---|---|---|---|---|---|
| Program | Read | 0 | 1K | 2K | 3K | 5K | 6K | 7K | 8K | 9K | 10K | 11K | 12K | 13K |
| 35 | 35 | 170 | 170 | 170 | 171 | 170 | 170 | 170 | 170 | 170 | 171 | 171 | 171 | 171 |
| | 40 | 170 | 170 | 170 | 170 | 170 | 170 | 170 | 170 | 170 | 171 | 171 | 171 | 171 |
| | 45 | 170 | 170 | 170 | 170 | 170 | 170 | 170 | 170 | 170 | 170 | 170 | 171 | 170 |
| | 50 | 170 | 170 | 170 | 170 | 170 | 170 | 170 | 170 | 170 | 170 | 170 | 170 | 170 |
| | 55 | 170 | 170 | 170 | 170 | 170 | 170 | 170 | 170 | 170 | 170 | 171 | 171 | 170 | 170 |

TABLE 4-continued

| Temperature | | PE Cycle | | | | | | | | | | | | |
|---|---|---|---|---|---|---|---|---|---|---|---|---|---|---|
| Program | Read | 0 | 1K | 2K | 3K | 5K | 6K | 7K | 8K | 9K | 10K | 11K | 12K | 13K |
| | 60 | 170 | 171 | 170 | 171 | 170 | 170 | 171 | 171 | 170 | 171 | 171 | 171 | 171 |
| | 65 | 170 | 171 | 171 | 171 | 171 | 171 | 171 | 171 | 171 | 171 | 171 | 171 | 171 |
| | 70 | 171 | 171 | 171 | 171 | 171 | 171 | 171 | 171 | 171 | 171 | 171 | 171 | 171 |
| | 75 | 170 | 171 | 171 | 171 | 171 | 171 | 171 | 171 | 171 | 171 | 171 | 171 | 171 |
| 40 | 35 | 170 | 170 | 170 | 170 | 170 | 170 | 170 | 170 | 170 | 171 | 171 | 171 | 170 |
| | 40 | 170 | 170 | 170 | 171 | 171 | 170 | 170 | 171 | 170 | 171 | 171 | 171 | 171 |
| | 45 | 170 | 171 | 170 | 170 | 170 | 170 | 170 | 170 | 170 | 171 | 171 | 171 | 171 |
| | 50 | 170 | 170 | 170 | 170 | 170 | 170 | 170 | 170 | 170 | 171 | 171 | 170 | 171 |
| | 55 | 170 | 170 | 170 | 170 | 170 | 170 | 170 | 170 | 170 | 171 | 171 | 170 | 171 |
| | 60 | 170 | 171 | 170 | 171 | 170 | 170 | 171 | 171 | 170 | 171 | 171 | 171 | 171 |
| | 65 | 170 | 171 | 171 | 171 | 171 | 171 | 171 | 171 | 171 | 171 | 171 | 171 | 171 |
| | 70 | 171 | 171 | 171 | 171 | 171 | 171 | 171 | 171 | 171 | 171 | 171 | 171 | 171 |
| | 75 | 171 | 171 | 171 | 171 | 171 | 171 | 171 | 171 | 171 | 171 | 171 | 171 | 171 |
| 45 | 35 | 170 | 170 | 170 | 170 | 170 | 170 | 170 | 170 | 170 | 171 | 171 | 171 | 170 |
| | 40 | 170 | 170 | 171 | 171 | 170 | 170 | 170 | 170 | 170 | 171 | 171 | 171 | 171 |
| | 45 | 170 | 170 | 170 | 171 | 170 | 171 | 170 | 171 | 171 | 171 | 171 | 171 | 171 |
| | 50 | 170 | 170 | 170 | 171 | 170 | 170 | 170 | 170 | 170 | 171 | 171 | 171 | 171 |
| | 55 | 170 | 170 | 170 | 171 | 170 | 170 | 170 | 170 | 170 | 171 | 171 | 171 | 171 |
| | 60 | 170 | 171 | 170 | 171 | 170 | 170 | 170 | 171 | 170 | 171 | 171 | 171 | 171 |
| | 65 | 170 | 171 | 170 | 171 | 170 | 171 | 171 | 171 | 171 | 171 | 171 | 171 | 171 |
| | 70 | 170 | 171 | 171 | 171 | 171 | 171 | 171 | 171 | 171 | 171 | 171 | 171 | 171 |
| | 75 | 170 | 171 | 171 | 171 | 171 | 171 | 171 | 171 | 171 | 171 | 171 | 171 | 171 |
| 50 | 35 | 170 | 170 | 170 | 170 | 170 | 170 | 170 | 170 | 170 | 171 | 171 | 170 | 170 |
| | 40 | 170 | 170 | 170 | 171 | 171 | 170 | 170 | 170 | 170 | 171 | 171 | 171 | 171 |
| | 45 | 170 | 170 | 170 | 171 | 170 | 170 | 170 | 170 | 170 | 171 | 171 | 171 | 171 |
| | 50 | 170 | 171 | 170 | 171 | 170 | 170 | 170 | 170 | 170 | 171 | 171 | 171 | 171 |
| | 55 | 170 | 171 | 170 | 171 | 170 | 170 | 171 | 171 | 170 | 171 | 171 | 171 | 171 |
| | 60 | 170 | 171 | 171 | 171 | 170 | 170 | 171 | 171 | 170 | 171 | 171 | 171 | 171 |
| | 65 | 170 | 171 | 171 | 171 | 170 | 171 | 171 | 171 | 170 | 171 | 171 | 171 | 171 |
| | 70 | 170 | 171 | 171 | 171 | 171 | 171 | 171 | 171 | 170 | 171 | 171 | 171 | 171 |
| | 75 | 170 | 170 | 171 | 171 | 171 | 171 | 171 | 171 | 171 | 171 | 171 | 171 | 171 |
| 55 | 35 | 170 | 170 | 170 | 170 | 170 | 170 | 170 | 170 | 170 | 171 | 171 | 170 | 170 |
| | 40 | 170 | 170 | 171 | 170 | 170 | 171 | 170 | 170 | 170 | 171 | 171 | 171 | 170 |
| | 45 | 170 | 170 | 170 | 171 | 170 | 170 | 170 | 170 | 170 | 171 | 171 | 171 | 171 |
| | 50 | 170 | 170 | 170 | 171 | 170 | 170 | 171 | 170 | 170 | 171 | 171 | 171 | 171 |
| | 55 | 170 | 170 | 170 | 171 | 170 | 170 | 171 | 170 | 170 | 171 | 171 | 171 | 171 |
| | 60 | 170 | 171 | 171 | 171 | 171 | 171 | 171 | 171 | 171 | 171 | 171 | 171 | 171 |
| | 65 | 170 | 171 | 171 | 171 | 171 | 171 | 171 | 171 | 171 | 171 | 171 | 171 | 171 |
| | 70 | 170 | 171 | 170 | 171 | 171 | 171 | 171 | 171 | 170 | 171 | 171 | 171 | 171 |
| | 75 | 170 | 170 | 171 | 171 | 171 | 171 | 171 | 171 | 170 | 171 | 170 | 171 | 171 |
| 60 | 35 | 170 | 170 | 170 | 170 | 170 | 170 | 170 | 170 | 170 | 170 | 171 | 170 | 170 |
| | 40 | 170 | 170 | 170 | 170 | 170 | 170 | 170 | 170 | 170 | 171 | 171 | 171 | 170 |
| | 45 | 170 | 170 | 170 | 171 | 170 | 170 | 171 | 170 | 170 | 170 | 171 | 171 | 171 |
| | 50 | 170 | 170 | 170 | 171 | 170 | 170 | 170 | 170 | 170 | 171 | 171 | 171 | 171 |
| | 55 | 170 | 171 | 170 | 171 | 170 | 171 | 171 | 171 | 171 | 171 | 171 | 171 | 171 |
| | 60 | 170 | 171 | 171 | 171 | 171 | 171 | 171 | 171 | 171 | 171 | 171 | 171 | 171 |
| | 65 | 170 | 171 | 171 | 171 | 171 | 171 | 171 | 171 | 171 | 171 | 171 | 171 | 171 |
| | 70 | 170 | 171 | 171 | 171 | 171 | 171 | 171 | 171 | 171 | 171 | 171 | 171 | 171 |
| | 75 | 170 | 170 | 171 | 171 | 171 | 171 | 171 | 171 | 170 | 171 | 170 | 171 | 171 |
| 65 | 35 | 170 | 170 | 170 | 170 | 170 | 170 | 170 | 170 | 170 | 170 | 170 | 170 | 170 |
| | 40 | 170 | 170 | 170 | 170 | 170 | 170 | 170 | 170 | 170 | 170 | 170 | 170 | 170 |
| | 45 | 170 | 170 | 170 | 170 | 170 | 170 | 170 | 170 | 170 | 170 | 170 | 170 | 170 |
| | 50 | 170 | 170 | 170 | 170 | 170 | 170 | 170 | 170 | 170 | 171 | 171 | 171 | 171 |
| | 55 | 170 | 170 | 170 | 170 | 170 | 170 | 170 | 170 | 170 | 171 | 171 | 171 | 171 |
| | 60 | 170 | 171 | 170 | 171 | 171 | 171 | 171 | 171 | 170 | 171 | 171 | 171 | 171 |
| | 65 | 170 | 171 | 171 | 171 | 171 | 171 | 171 | 171 | 171 | 171 | 171 | 171 | 171 |
| | 70 | 170 | 171 | 171 | 171 | 171 | 171 | 171 | 171 | 171 | 171 | 171 | 171 | 171 |
| | 75 | 170 | 170 | 170 | 171 | 170 | 171 | 170 | 170 | 170 | 171 | 170 | 171 | 170 |
| 70 | 35 | 170 | 170 | 170 | 170 | 170 | 170 | 169 | 170 | 169 | 170 | 170 | 170 | 170 |
| | 40 | 170 | 170 | 170 | 170 | 170 | 170 | 170 | 170 | 170 | 170 | 170 | 170 | 170 |
| | 45 | 170 | 170 | 170 | 170 | 170 | 170 | 170 | 170 | 170 | 170 | 170 | 170 | 170 |
| | 50 | 170 | 170 | 170 | 170 | 170 | 170 | 170 | 170 | 170 | 171 | 170 | 170 | 171 |
| | 55 | 170 | 171 | 170 | 171 | 170 | 170 | 171 | 171 | 171 | 171 | 171 | 171 | 171 |
| | 60 | 170 | 171 | 171 | 171 | 171 | 171 | 171 | 171 | 171 | 171 | 171 | 171 | 171 |
| | 65 | 170 | 171 | 171 | 171 | 171 | 171 | 171 | 171 | 170 | 171 | 171 | 171 | 171 |
| | 70 | 170 | 171 | 170 | 171 | 170 | 171 | 171 | 171 | 170 | 171 | 171 | 171 | 171 |
| | 75 | 170 | 171 | 170 | 171 | 170 | 171 | 171 | 171 | 170 | 171 | 170 | 171 | 170 |
| 75 | 35 | 169 | 170 | 170 | 170 | 170 | 169 | 169 | 169 | 169 | 170 | 170 | 170 | 170 |
| | 40 | 170 | 170 | 170 | 170 | 170 | 170 | 170 | 170 | 170 | 170 | 170 | 170 | 170 |
| | 45 | 170 | 170 | 170 | 170 | 170 | 170 | 170 | 170 | 170 | 170 | 170 | 170 | 170 |
| | 50 | 170 | 170 | 170 | 170 | 170 | 170 | 170 | 170 | 170 | 170 | 170 | 170 | 171 |
| | 55 | 170 | 171 | 170 | 171 | 170 | 170 | 170 | 170 | 170 | 171 | 171 | 171 | 171 |
| | 60 | 170 | 171 | 171 | 171 | 171 | 171 | 171 | 171 | 170 | 171 | 171 | 171 | 171 |

TABLE 4-continued

| Temperature | | PE Cycle | | | | | | | | | | | | |
|---|---|---|---|---|---|---|---|---|---|---|---|---|---|---|
| Program | Read | 0 | 1K | 2K | 3K | 5K | 6K | 7K | 8K | 9K | 10K | 11K | 12K | 13K |
| | 65 | 170 | 171 | 171 | 171 | 171 | 171 | 171 | 171 | 170 | 171 | 171 | 171 | 171 |
| | 70 | 170 | 171 | 171 | 171 | 171 | 171 | 171 | 171 | 170 | 171 | 171 | 171 | 171 |
| | 75 | 170 | 170 | 170 | 171 | 171 | 170 | 170 | 171 | 170 | 170 | 170 | 171 | 170 |

Read disturbance was characterized using the parameter MD P3-P7 as shown in Table 5. The reason for gradual narrowing of the center distance of MD P3-P7 in read disturbance is retention during read disturbance rather than read disturbance. Although it took less than 1 day for the read count to reach 2.0M, and MD P3-P7 was narrowed down from 170 to 166 even considering all P/E cycles, it can be ascertained that retention is not misjudged because MD P3-P7 was narrowed down to 170 to 165 even considering all P/E cycles during retention of 1 day.

According to the present invention, it is possible to provide an opportunity to preemptively cope with errors and prevent QoS degradation by parameterizing a center distance between patterns of a threshold voltage distribution of NAND flash memory cells to characterize an error source of the NAND flash memory.

In particular, with respect to the retention error that cannot be easily tracked although there are factors that accelerate errors even during power-off, it is possible to determine a degree to which data has been affected by the retention error even after power is re-supplied, thereby allowing a storage device to preemptively cope with the retention error.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

All simple modifications or changes of the present invention belong to the scope of the present invention, and the specific scope of the present invention will be clarified by the appended claims.

What is claimed is:

1. A method of characterizing errors in a NAND flash memory, performed by a computing device, comprising:
   step (a) of setting, as a parameter, a center distance between one pattern and another pattern among a plurality of patterns within a threshold voltage distribution of NAND flash memory cells; and
   step (b) of characterizing an error source of the NAND flash memory by obtaining a value of the center distance for each program/erase (P/E) cycle by applying the parameter,
   wherein the plurality of patterns corresponds to an erase state ER and first to N-th (N being a natural number of 3 or more) programmed states in order of increasing threshold voltage of programmed wordlines,
   wherein the error source of the NAND flash memory is at least one of a retention, a read disturbance, and a cross temperature,
   wherein, in the step (b), a first center distance value according to a retention period for each P/E cycle is obtained and converted into information when the error source is the retention,
   wherein, in the step (b), a second center distance value according to a read count for each P/E cycle is obtained and converted into information when the error source is the read interruption, and
   wherein, in the step (b), a third center distance value according to a program temperature and a read temperature for each P/E cycle is obtained and converted into information when the error source is the cross temperature.

2. The method of claim 1, wherein, when the NAND flash memory cells are multi-level cells (MLCs) having an erase state ER and first to third programmed states P1 to P3 in order of increasing threshold voltage, the parameter is a center distance between a first pattern corresponding to the first programmed state and a second pattern corresponding to the third programmed state, and the error source of the NAND flash memory is the retention.

3. The method of claim 1, wherein, when the NAND flash memory cells are triple level cells (TLCs) having an erase state ER and first to seventh programmed states P1 to P7 in order of increasing threshold voltage, the parameter is a center distance between a first pattern corresponding to the third programmed state and a second pattern corresponding to the seventh programmed state, and the error source of the NAND flash memory is the retention.

4. The method of claim 1, wherein, when the NAND flash memory cells are quadruple level cells (QLCs) having an erase state ER and first to fifteenth programmed states P1 to P15 in order of increasing threshold voltage, the parameter is a center distance between a first pattern corresponding to the sixth programmed state and a second pattern corresponding to the fifteenth programmed state, and the error source of the NAND flash memory is the retention.

5. The method of claim 1, wherein, when the NAND flash memory cells are triple level cells (TLCs) having an erase state ER and first to seventh programmed states P1 to P7 in order of increasing threshold voltage, the parameter is a center distance between a first pattern corresponding to the first programmed state and a second pattern corresponding to any one of the second to fourth programmed states, and the error source of the NAND flash memory is the read disturbance.

6. The method of claim 1, wherein the parameter is calculated on the basis of an accumulated number of NAND flash memory cells.

7. A method of estimating an error in an estimation target NAND flash memory, performed by a storage device including a memory controller and a memory device, the method comprising:
   step (a) of setting, as a parameter, a center distance between one pattern and another pattern among a plurality of patterns within a threshold voltage distribution of standard NAND flash memory cells; and
   step (b) of characterizing a retention error source of the standard NAND flash memory by obtaining a value of the center distance for each program/erase (P/E) cycle by applying the parameter, step (c) of calculating a predetermined center distance value by applying a parameter for the retention error source to the estimation target NAND flash memory, and obtaining predetermined P/E cycle information; and step (d) of estimating a retention error of the estimation target NAND flash memory by comparing retention error characterization information generated in the step (b) with the predetermined center distance value and the predetermined P/E cycle information, wherein the plurality of patterns corresponds to an erase state ER and first to N-th (N being a natural number of 3 or more) programmed states in order of increasing threshold voltage of programmed wordlines, and wherein, in the step (b), the center distance value according to a retention period for each P/E cycle is obtained and converted into information.

8. A storage device control method performed in a storage device including a memory controller and a memory device, comprising:

(a) estimating, by the memory controller, the retention error by the method according to claim 7; and (b) controlling, by the memory controller, at least one of refreshing, setting of a read bias, setting of a decoding method, or setting of a bad block with respect to the memory device on the basis of the estimated retention error.

\* \* \* \* \*